United States Patent
Radke

(10) Patent No.: US 8,938,657 B2
(45) Date of Patent: Jan. 20, 2015

(54) DATA AND ERROR CORRECTION CODE MIXING DEVICE AND METHOD

(71) Applicant: Micron Technology, Inc., Boise, ID (US)

(72) Inventor: William Henry Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/153,703

(22) Filed: Jan. 13, 2014

(65) Prior Publication Data

US 2014/0129906 A1 May 8, 2014

Related U.S. Application Data

(62) Division of application No. 13/746,189, filed on Jan. 21, 2013, now Pat. No. 8,631,302, which is a division of application No. 12/192,426, filed on Aug. 15, 2008, now Pat. No. 8,359,514.

(51) Int. Cl.
*G11C 29/00* (2006.01)
*H03M 13/05* (2006.01)
*G06F 11/10* (2006.01)

(52) U.S. Cl.
CPC .............. *H03M 13/05* (2013.01); *G11C 29/00* (2013.01); *G06F 11/1012* (2013.01); *G06F 11/1008* (2013.01); *G06F 11/1072* (2013.01)
USPC ................... 714/763; 365/185.09; 365/185.33

(58) Field of Classification Search
CPC ...... H03M 13/05; G06F 11/1008; G11C 29/00
USPC ................................................ 714/763, 773
See application file for complete search history.

(56) References Cited

U.S. PATENT DOCUMENTS

| | | | |
|---|---|---|---|
| 5,956,305 A | 9/1999 | Takahashi | |
| 6,070,262 A * | 5/2000 | Kellogg et al. | 714/763 |
| 6,357,030 B1 | 3/2002 | Demura et al. | |
| 6,526,537 B2 * | 2/2003 | Kishino | 714/763 |
| 6,553,532 B1 * | 4/2003 | Aoki | 714/763 |
| 6,725,343 B2 | 4/2004 | Barroso et al. | |
| 7,055,082 B2 * | 5/2006 | Mori et al. | 714/768 |
| 7,149,945 B2 | 12/2006 | Brueggen | |
| 7,159,165 B2 * | 1/2007 | Hwang et al. | 714/769 |
| 7,227,797 B2 | 6/2007 | Thayer et al. | |
| 7,362,618 B2 * | 4/2008 | Harari et al. | 365/185.33 |
| 7,392,347 B2 * | 6/2008 | Briggs | 711/129 |
| 7,401,268 B2 | 7/2008 | Noda et al. | |
| 7,437,658 B2 * | 10/2008 | Kobayashi | 714/801 |
| 7,599,235 B2 | 10/2009 | Thayer | |
| 8,136,014 B2 | 3/2012 | Uchikawa et al. | |
| 8,250,403 B2 * | 8/2012 | Lee | 714/6.22 |
| 8,266,496 B2 * | 9/2012 | Flynn et al. | 714/758 |
| 8,359,514 B2 | 1/2013 | Radke | |
| 8,631,302 B2 | 1/2014 | Radke | |
| 2010/0042908 A1 | 2/2010 | Radke | |
| 2013/0132802 A1 | 5/2013 | Radke | |

\* cited by examiner

*Primary Examiner* — Esaw Abraham
(74) *Attorney, Agent, or Firm* — Schwegman Lundberg & Woessner, P.A.

(57) ABSTRACT

Memory devices and methods are described such as those that mix data and associated error correction code blocks between multiple memory device locations. Examples include mixing between multiple memory blocks, mixing between memory pages, mixing between memory chips and mixing between memory modules. In selected examples, memory blocks and associated error correction code are mixed between multiple levels of memory device hierarchy.

14 Claims, 5 Drawing Sheets

DATA AND ERROR CORRECTION CODE MIXING DEVICE AND METHOD

PRIORITY APPLICATION

This application is a divisional of U.S. application Ser. No. 13/746,189, filed Jan. 21, 2013, now issued as U.S. Pat. No. 8,631,302, which is a divisional of U.S. application Ser. No. 12/192,426, filed Aug. 15, 2008, now issued as U.S. Pat. No. 8,359,514, all of which are incorporated herein by reference in their entirety.

BACKGROUND

Computer memory devices store data in bits within individual memory cells that can be represented as zeros or ones. Frequently, for any number of reasons, selected memory cells or groups of memory cells fail in either a reading or writing operation. Given that a number of memory cells will fail, an error correction code is commonly generated and stored in the computer memory with an associated amount of data, which is referred to herein as a "block" of data. The error correction code (ECC) can be used for example to predict what the state of the failed memory cells would likely have been, and in some cases is used to "correct" for the small number of failed memory cells. Improvements in ECC are always desirable.

DETAILED DESCRIPTION

Figure 1:
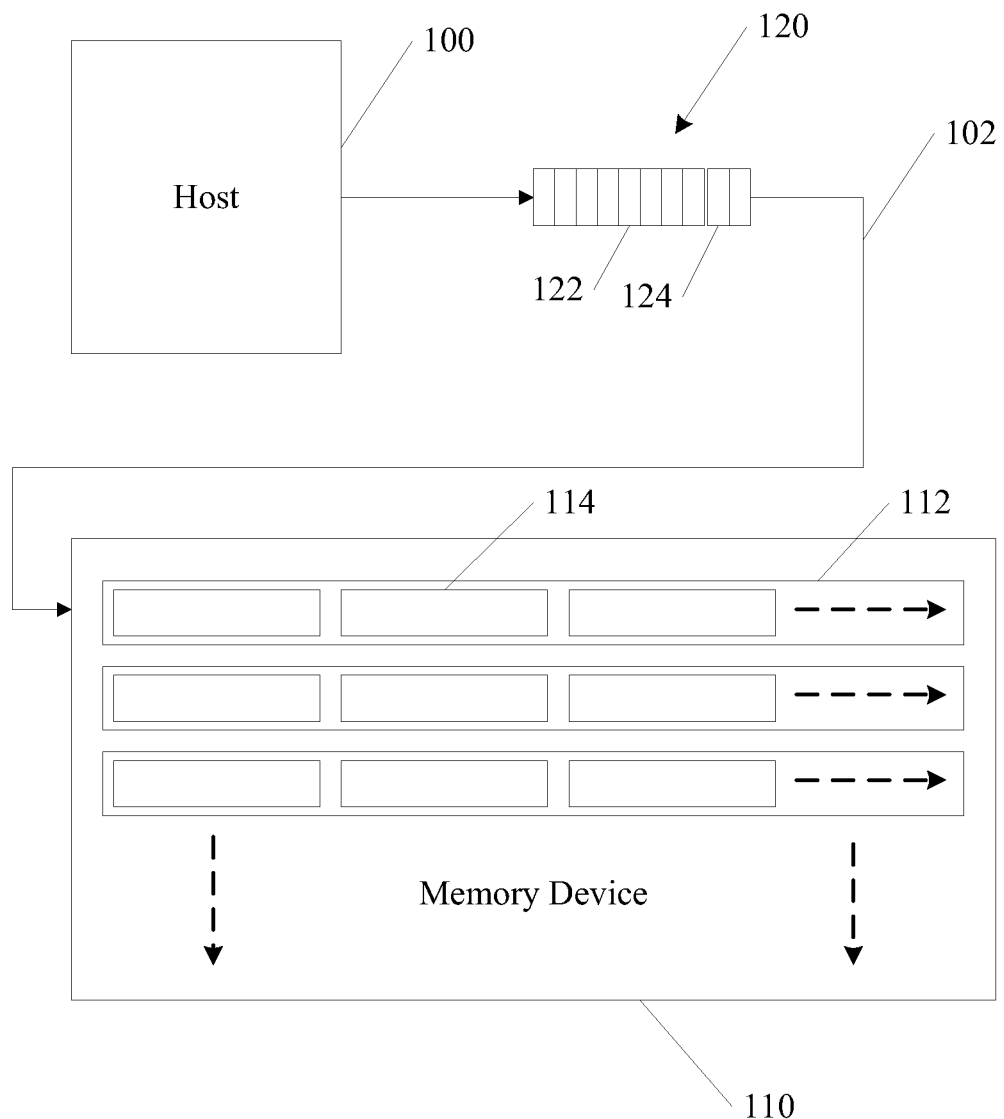
FIG. 1 shows a block diagram of a system according to an embodiment of the invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made.

FIG. 1 shows an information handling system, including a host 100 and a memory device 110. In one example, the memory device is a solid state random access memory device such as dynamic random access memory or flash memory, however, embodiments of the invention are not so limited. Examples of a host 100 include a processor, or other data writing and management devices. In selected examples, the host 100, and the memory device 110 are integrated into a larger device such as a personal computer, a video or audio playing device, a portable or hand held device, a mobile telephone, etc.

FIG. 1 further shows a block 120 being sent from the host 100 to the memory device 110. A path 102 illustrates at least a portion of circuitry used to read and write the block 120. The block 120 is shown sub-divided into portions. A number of data portions 122 are shown with a number of ECC portions that are associated with the number of data portions 122. One of ordinary skill in the art, having the benefit of the present disclosure will recognize that ECC is written to protect a certain amount of data. In one embodiment, the ECC protects a 512 byte block. Other block sizes are also possible.

In operation, the block 120 is stored within the memory device 110 in storage that is broken down into a hierarchy of levels. The memory device 110 shown in FIG. 1 is arranged in a number of pages 112, each with a number of block locations 114. In one embodiment, the memory device 110 further includes a number of chips, each with a page and block structure. In one embodiment, the memory device 110 includes a plurality of memory modules, each with a plurality of chips. Other memory structures such as hard disk drive structures, optical drive structures, etc. and their associated hierarchy levels are also possible.

Figure 2:
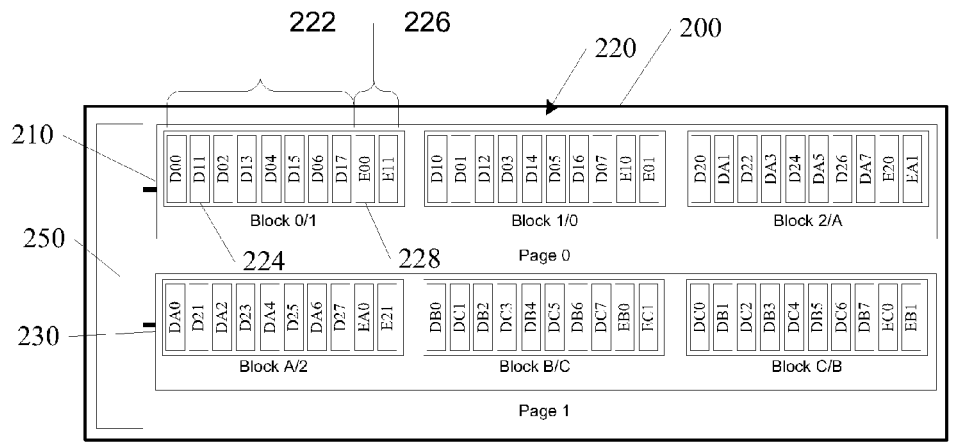
FIG. 2 shows a block diagram of a portion of a memory device according to an embodiment of the invention.

FIG. 2 shows an example memory device 200. For illustration, in the example of FIG. 2, the memory device 200 is a random access memory (RAM) chip. A first page 210 and a second page 230 are shown within the memory device 200. Within each page are a number of block storage locations 220. The first page 210 is shown with three block storage locations 220. Although only two pages and only three block storage locations for each page are shown for illustration, a larger scale memory device is more typical. In one example, the block storage locations 220 each include storage for 512 bytes. Other sizes of block storage locations 220 are also possible.

Circuitry 250 is illustrated for use in writing or reading data and ECC from various pages or block storage locations within the memory device 200. FIG. 2 illustrates at least a portion of the circuitry 250 located within the memory device 200. Other embodiments locate the circuitry 250 in any of a number of physical locations. In other examples the circuitry 250 is located at least partially within a host, or separate from both the host and the memory device.

As discussed above, to help ensure reliability in memory operations, an ECC portion is associated with each block storage location. FIG. 2 illustrates a data portion 222 of the block storage location 220, and an ECC portion 226 of the block storage location 220. FIG. 2 illustrates the data portion 222 being broken down into a number of smaller sub-portions 224. Similarly, FIG. 2 illustrates the ECC portion 226 being broken down into a number of sub-portions 228.

For illustration, FIG. 2 shows the data portion 222 being arranged in eight sub-portions, and the ECC portion 226 being arranged in two sub-portions. Other numbers of sub-portions for both the data portion 222 and the ECC portion 226 are possible. In FIG. 2, all sub-portions are shown of equal size, although the embodiments of the invention are not so limited. In one example the sub-portions vary in size.

FIG. 2 illustrates an embodiment where portions of data and associated ECC are mixed between block storage locations 220. Any number of mixing configurations are possible, such as random mixing of portions, regular interleaving of portions, etc. FIG. 2 illustrates an example where data and ECC are interleaved between block storage locations 220 within a page.

For illustration, blocks 120 being sent to the first page 210 are labeled sequentially "0", "1", "2", etc. Blocks 120 being sent to the second page 230 are labeled "A", "B", "C", etc. As discussed in FIG. 1, a block 120 is sub-divided into a number of portions. Likewise, the block storage locations 220 are broken down into sub-portions. Data sub-portions 122 of block "0" are identified in FIG. 2 as D00 D01, D02, etc. up to D08 for eight sub-portions as in the illustration, although more than eight sub-portions are of course possible. Associated ECC sub-portions for the block "0" are identified as E00, E01, etc. for as many sub-portions as are desired. Two ECC sub portions are shown for each block 120 in FIGS. 1 and 2.

FIG. 2 illustrates a mixing of sub-portions of blocks 120 in multiple block storage locations 220. More specifically, the example of FIG. 2, illustrates mixing of sub-portions of blocks 120 between block storage locations 220 within the same page. Block storage locations 220 are labeled to indicate the mixing configuration shown. For example block storage location "0/1" indicates mixing of block "0" and block "1" within the single block storage location 220. Likewise, block storage location "1/0" indicates mixing of block "1" and block "0" within the single block storage location 220.

Errors or defects that require correction by ECC are frequently grouped into physical locations on a memory device 200. ECC is in many cases is only able to correct for a certain number of errors within its associated block 120. Therefore if the block 120 is written only onto a single block storage location 220 with a physical grouping of errors, the ECC is less effective at correcting the errors.

By mixing blocks such as block "0" and block "1" as illustrated in FIG. 2, over more than one block storage location 220, the data and ECC from blocks "0" and "1" are spread out over multiple block storage locations 220. Therefore, in the event of a grouping of errors in physical locations within the memory device 200, the ECC is statistically more likely to be able to correct for the grouping of errors. By mixing blocks within block storage locations in a given page, any block-based weaknesses are better compensated for than without mixing.

FIG. 2 illustrates mixing blocks 120 between two paired block storage locations 220. Although mixing between a pair of block storage locations is shown, other embodiments include mixing between more than two block storage locations.

FIG. 2 also shows the last block storage location in page 0 being mixed with the first block storage location in page 1. By mixing blocks between block storage locations in different pages, any page-based weaknesses are better compensated for than without mixing.

Figure 3:
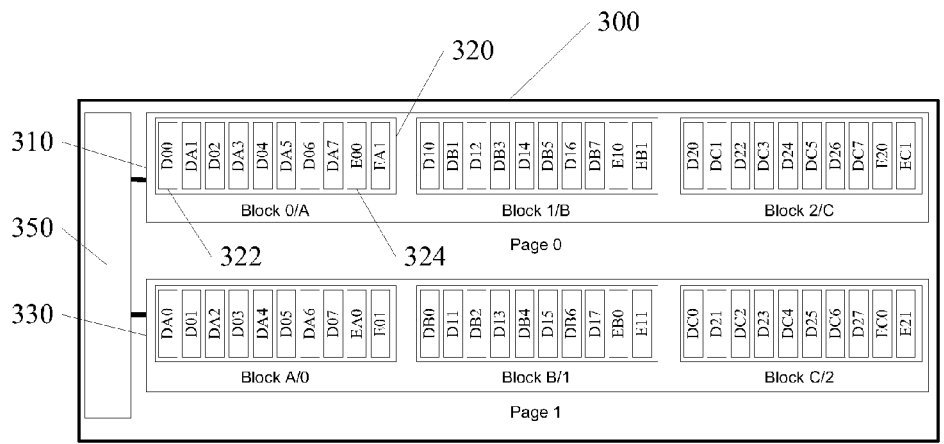
FIG. 3 shows a block diagram of a portion of another memory device according to an embodiment of the invention.

FIG. 3 illustrates more mixing of blocks between block storage locations on different pages. Similar to FIG. 2, an example memory device 300 is shown in FIG. 3. A first page 310 and a second page 330 are shown within the memory device 300. Within each page, are a number of block storage locations 320. FIG. 3 illustrates data portions of the block storage locations 320 being broken down into a number of smaller sub-portions 322. Similarly, FIG. 3 illustrates the ECC portions of the block storage locations 320 being broken down into a number of sub-portions 324.

Similar to FIG. 2, circuitry 350 is illustrated for use in writing or reading data and ECC from various pages or block storage locations within the memory device 200. FIG. 3 illustrates at least a portion of the circuitry 350 located within the memory device 300. Other embodiments locate the circuitry 350 in any of a number of physical locations.

As shown by the block storage location naming convention described above, in FIG. 3, block storage location "0/A" includes mixed portions of block "0" and block "A." Likewise, block storage location "1/B" includes mixed portions of block "1" and block "B," and block storage location "2/C" includes mixed portions of block "2" and block "C."

By further mixing blocks between pages, any page based or page grouped errors may be reduced. Examples of page grouped errors that are reduced using example configurations such as FIG. 3 include, but are not limited to bad programs, read disturbs, coloring effects, and bad boundary pages. Block based problems are also accounted for, such as read disturb, electron trapping, write disturb, etc.

In one example the benefit of mixing is further extended to other levels of storage hierarchy, such as between pages in different chips. In this way chip bases errors may be reduced.

Figure 4:
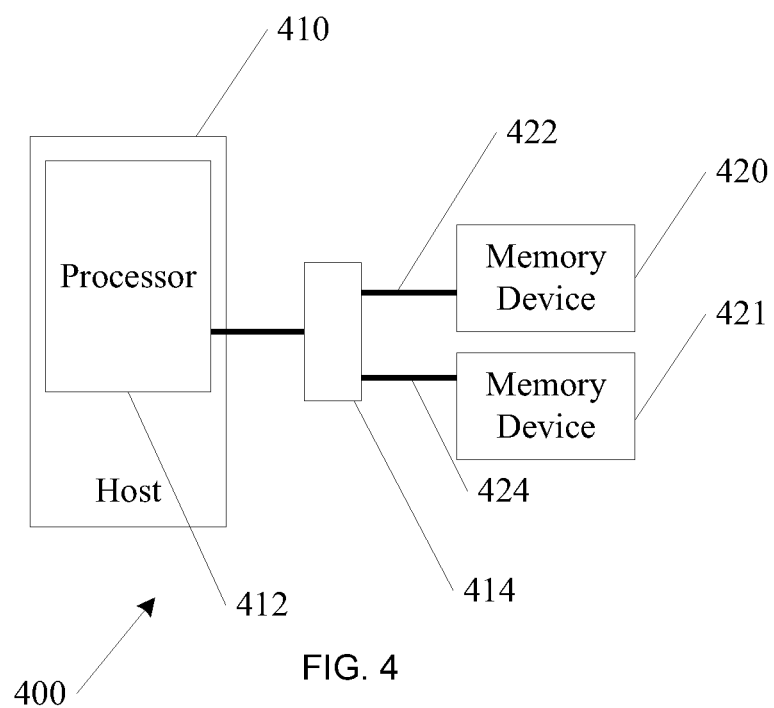
FIG. 4 shows a block diagram of an information handling system according to an embodiment of the invention.

FIG. 4 illustrates an information handling system 400 showing another hierarchy configuration of storage. A host 410 is shown having a processor 412 directing data operations such as reading and writing. At least two memory devices including a first memory device 420, and a second memory device 421 are shown coupled to the host 410. FIG. 4 illustrates a memory controller 414 that is in communication with the processor 412 and the memory devices 420 and 421. In one example, the memory controller 414 includes a multiplexer to interleave, or otherwise mix portions of data and ECC blocks from the host 410. Although the memory controller is shown separate from the memory devices 420, 421 and the host 410, FIG. 4 is intended as a block diagram illustration only. The memory controller can be located in whole or in part in various physical locations.

In one example, each of the memory devices 420, 421 illustrates a memory chip. Using methods and devices described above, blocks of data and ECC are mixed between individual chips to better protect from an individual chip that suffers from a lower standard of performance than other chips in the plurality of memory devices.

Using the configuration in FIG. 4, mixing is accomplished using the memory controller 414 as a multiplexer, and interleaving two streams of data and ECC between the first memory device 420 and the second memory device 421. The portions of data blocks and ECC are transmitted to the first memory device 420 through a first information IO pathway 422, and to the second memory device 421 through a second information IO pathway 424. In one example, interleaving is accomplished by switching back and forth between the first information IO pathway 422 and the second information IO pathway 424.

In another example, each of the memory devices 420, 421 illustrates a memory module such as a flash card, each with multiple chips. Extending the mixing concept to each level of a memory hierarchy provides a new level of increased reliability, in particular for errors associated with individual levels in the hierarchy.

Although individual levels of memory hierarchy are described separately in conjunction with mixing, embodiments of the invention are not so limited. In one example, blocks or other discrete data and ECC groups are mixed on multiple hierarchy levels at the same time. In one example, blocks are mixed on a page level as described in FIGS. 2 and 3, while further being mixed on levels such as between chips, or modules.

Figure 5:
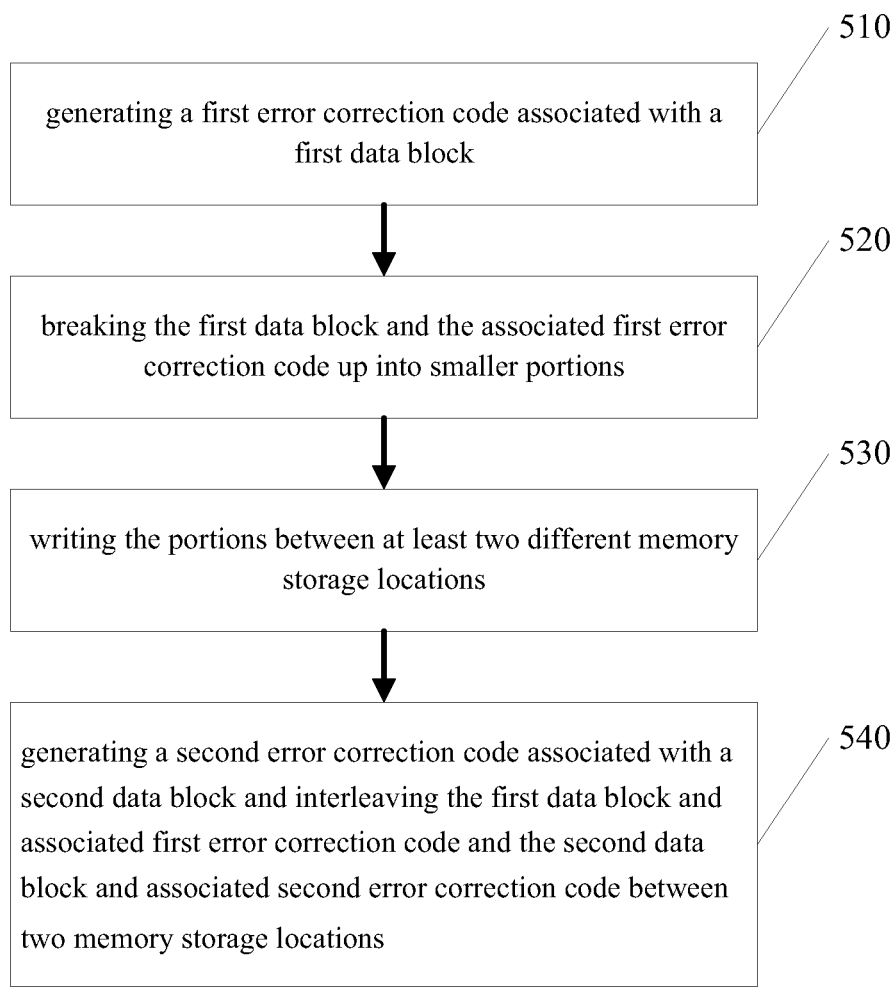
FIG. 5 shows a flow chart of a method according to an embodiment of the invention.

FIG. 5 illustrates one mixing method for writing to a memory device according to an embodiment of the invention. In operation 510, ECC is generated and associated with a first data block. In operation 520, the first data block and the associated ECC are broken up into smaller portions. In operation 530, the portions are written between at least two different memory storage locations. As discussed above by increasing the physical area over which the data and ECC are written, risk associated with physically grouped errors in the memory device is reduced.

In operation 540, in addition to writing the first data block and ECC over a larger area, a second ECC is generated and associated with a second data block. The first data block and ECC are interleaved with the second date block and ECC. Although two memory storage locations are used to describe the example method of FIG. 5, more than two memory storage locations can also be used to further spread out data and ECC over a larger physical memory device area. As discussed in embodiments above, several hierarchy levels of memory storage locations are possible. Examples include memory block locations, memory pages, memory chips, memory modules, or other memory hierarchy levels that apply to devices such as hard disk drives, or optical drives, etc.

Figure 6:
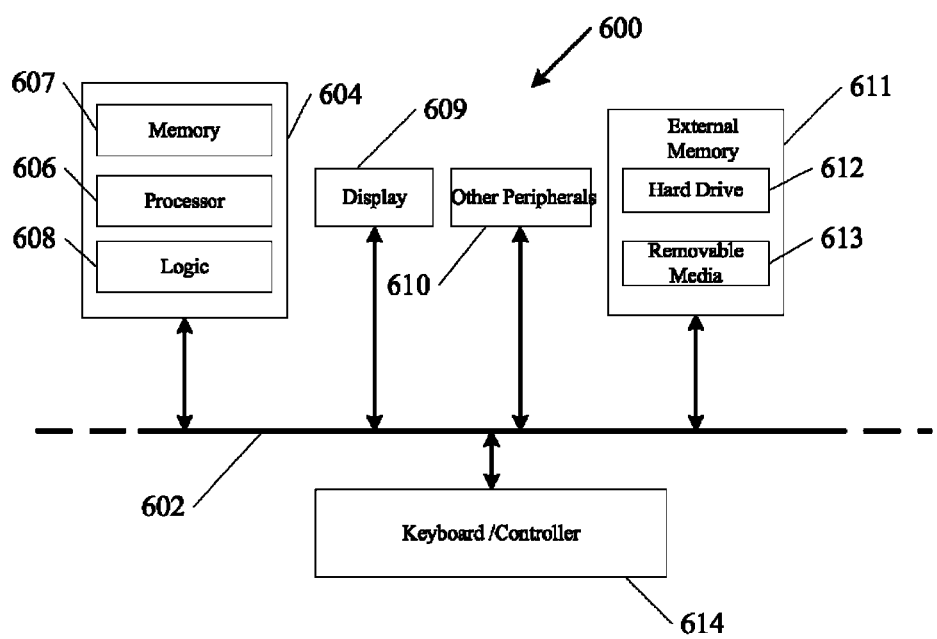
FIG. 6 shows a block diagram of a more detailed information handling system according to an embodiment of the invention.

A further embodiment of an information handling system such as a computer is included in FIG. 6 to show a higher level device application for the present invention. FIG. 6 is a block diagram of an information handling system 600 incorporating at least one chip or chip assembly 604 that includes a memory device according to an embodiment of the invention. Information handling system 600 is merely one embodiment of an electronic system in which the present invention can be used. Other examples include, but are not limited to, personal data assistants (PDAs), cellular telephones, MP3 players, aircraft, satellites, vehicles, etc.

In this example, information handling system 600 comprises a data processing system that includes a system bus 602 to couple the various components of the system. System bus 602 provides communications links among the various components of the information handling system 600 and may be implemented as a single bus, as a combination of busses, or in any other suitable manner.

Chip assembly 604 is coupled to the system bus 602. Chip assembly 604 may include any circuit or operably compatible combination of circuits. In one embodiment, chip assembly 604 includes a processor 606 that can be of any type. As used herein, "processor" means any type of computational circuit such as, but not limited to, a microprocessor, a microcontroller, a graphics processor, a digital signal processor (DSP), or any other type of processor or processing circuit.

In one embodiment, a memory chip 607 is included in the chip assembly 604. Those skilled in the art will recognize that a wide variety of memory device configurations may be used in the chip assembly 604. Acceptable types of memory chips include, but are not limited to, Dynamic Random Access Memory (DRAMs) such as SDRAMs, SLDRAMs, RDRAMs and other DRAMs. Memory chip 607 can also include non-volatile memory such as flash memory. In one embodiment, the memory chip 607 includes a phase change random access memory (PCRAM).

In one embodiment, additional logic chips 608 other than processor chips are included in the chip assembly 604. An example of a logic chip 608 other than a processor includes an analog to digital converter. Other circuits on logic chips 608 such as custom circuits, an application-specific integrated circuit (ASIC), etc. are also included in one embodiment of the invention.

Information handling system 600 may also include an external memory 611, which in turn can include one or more memory elements suitable to the particular application, such as one or more hard drives 612, and/or one or more drives that handle removable media 613 such as flash memory drives, compact disks (CDs), digital video disks (DVDs), and the like. Memory devices in one or more of the above listed memory device locations and circuitry to mix blocks of data and ECC as described in examples above are included in the information handling system 600.

Information handling system 600 may also include a display device 609 such as a monitor, additional peripheral components 610, such as speakers, etc. and a keyboard and/or controller 614, which can include a mouse, trackball, game controller, voice-recognition device, or any other device that permits a system user to input information into and receive information from the information handling system 600.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon reviewing the above description. The scope of the invention includes any other applications in which the above structures and methods are used. The scope of the invention should be determined with reference to the appended claims, along with the full scope of equivalents to which such claims are entitled.

What is claimed is:

1. A method, comprising:
   generating a first error correction code associated with a first data block;
   generating a second error correction code associated with a second data block;
   respectively breaking the first data block and the associated first error correction code up into first and second portions; and
   writing the first and the second portions between at least two different memory storage locations, wherein writing the first and the second portions between at least two different memory storage locations includes mixing the first data block and the associated first error correction code and the second data block and the associated second error correction code between two memory storage locations.

2. The method of claim 1, wherein breaking the first data block includes breaking a 512 byte data block and the associated first error correction code up into portions.

3. The method of claim 1, wherein mixing the first data block and the associated first error correction code and the second data block and the associated second error correction code includes mixing on a plurality of storage location hierarchy levels.

4. The method of claim 3, wherein mixing on a plurality of storage location hierarchy levels includes mixing between memory blocks that are smaller than a memory page.

5. The method of claim 4, wherein mixing on a plurality of storage location hierarchy levels further includes mixing between memory pages.

6. The method of claim 5, wherein mixing on a plurality of storage location hierarchy levels further includes mixing between memory chips.

7. A method, comprising:
   generating a first error correction code associated with a first data block;
   respectively breaking the first data block and the associated first error correction code up into first and second portions; and
   sending the first and the second portions through a multiplexer for writing the first and the second portions between at least two different memory storage locations, wherein writing the first and the second portions between at least two different memory storage locations includes mixing the first and the second portions on a page level and a chip level.

8. The method of claim 7, wherein sending the first and the second portions through a multiplexer to write the first and the second portions between at least two different memory storage locations includes writing to at least two different memory storage locations within the same memory device.

9. The method of claim 7, wherein sending the first and the second portions through a multiplexer to write the first and the second portions between at least two different memory storage locations includes writing to at least two different memory storage locations within two or more different memory devices.

10. The method of claim 7, wherein writing the first and the second portions between at least two different solid state memory storage locations further includes writing the blocks of data on multiple memory hierarchical levels at the same time.

11. A method, comprising:
generating a first error correction code associated with a first data block;
respectively breaking the first data block and the associated first error correction code up into first and second portions; and
writing the first and the second portions between at least two different solid state memory storage locations, wherein writing the first and the second portions between at least two different solid state memory storage locations includes mixing the first and the second portions of the blocks of data on a page level and a chip level.

12. The method of claim 11, wherein writing the first and second portions between at least two different solid state memory storage locations further includes writing the blocks of data on multiple memory hierarchical levels at the same time.

13. A method, comprising:
generating a first error correction code associated with a first data block;
respectively breaking the first data block and the associated first error correction code up into first and second portions; and
writing the first and the second portions between at least two different solid state memory storage locations, wherein writing the first and the second portions between at least two different solid state memory storage locations includes mixing the first and the second portions of the blocks of data on a page level and a module level.

14. A method, comprising:
generating a first error correction code associated with a first data block;
respectively breaking the first data block and the associated first error correction code up into first and second portions; and
writing the first and the second portions between at least two different solid state memory storage locations, wherein writing the first and the second portions between at least two different solid state memory storage locations includes mixing the first and the second portions of the blocks of data on a page level, a chip level, and a module level.

* * * * *